(12) United States Patent
Beecher et al.

(10) Patent No.: US 9,950,351 B2
(45) Date of Patent: Apr. 24, 2018

(54) USER INTERFACES AND ASSOCIATED APPARATUS AND METHODS

(75) Inventors: Paul Beecher, Cambridge (GB); Piers Andrew, Cambridge (GB); Chris Bower, Ely (GB); Zoran Radivojevic, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 861 days.

(21) Appl. No.: 13/704,447

(22) PCT Filed: Jun. 25, 2010

(86) PCT No.: PCT/IB2010/001547
§ 371 (c)(1),
(2), (4) Date: Jan. 14, 2013

(87) PCT Pub. No.: WO2011/161489
PCT Pub. Date: Dec. 29, 2011

(65) Prior Publication Data
US 2013/0104323 A1 May 2, 2013

(51) Int. Cl.
*B29D 22/00* (2006.01)
*B08B 7/02* (2006.01)
*B08B 17/06* (2006.01)
*G06F 1/16* (2006.01)
*G06F 3/01* (2006.01)
*B08B 7/00* (2006.01)
(Continued)

(52) U.S. Cl.
CPC .............. *B08B 7/02* (2013.01); *B08B 7/0064* (2013.01); *B08B 17/06* (2013.01); *G06F 1/1626* (2013.01); *G06F 1/1643* (2013.01);

*G06F 1/1684* (2013.01); *G06F 3/016* (2013.01); *G06F 3/02* (2013.01); *H03K 17/962* (2013.01); *Y10T 428/24612* (2015.01); *Y10T 428/24802* (2015.01)

(58) Field of Classification Search
CPC ......... B08B 17/06; B08B 7/0064; B08B 7/02; H03K 17/962; Y10T 428/24612; Y10T 428/24802
See application file for complete search history.

(56) References Cited

U.S. PATENT DOCUMENTS

| 4,855,176 A | 8/1989 | Ohwaki et al. |
| 6,337,129 B1 | 1/2002 | Watanabe et al. ............ 428/328 |
| 2005/0052410 A1 | 3/2005 | Chen ............................. 345/156 |

(Continued)

FOREIGN PATENT DOCUMENTS

| DE | 202009015376 U1 | 3/2011 |
| EP | 0984388 A2 | 3/2000 |

(Continued)

OTHER PUBLICATIONS

English Abstract and Figure; KR2001104439A; Lee; 2001.*

*Primary Examiner* — James C Yager
(74) *Attorney, Agent, or Firm* — Harrington & Smith

(57) ABSTRACT

In one or more embodiments described herein, there is provided an apparatus for a user interface, the user interface including a user interface surface, the user interface surface including at least part of a self cleaning composition, the composition being configured to draw away at least one dermatological contaminant from one or more contaminated regions of the user interface surface to thereby provide a self-cleaning user interface surface.

14 Claims, 10 Drawing Sheets

(51) Int. Cl.
*G06F 3/02* (2006.01)
*H03K 17/96* (2006.01)

(56) References Cited

U.S. PATENT DOCUMENTS

| | | | |
|---|---|---|---|
| 2005/0186871 A1 | 8/2005 | Hockaday | 442/76 |
| 2005/0221098 A1 | 10/2005 | Azzopardi et al. | 428/446 |
| 2006/0236877 A1 | 10/2006 | Strand et al. | 101/6 |
| 2006/0251803 A1 | 11/2006 | Huizinga et al. | 427/162 |
| 2007/0137461 A1 | 6/2007 | Yamaguchi | 81/438 |
| 2007/0152985 A1 | 7/2007 | Ostergaard et al. | 345/176 |
| 2008/0196745 A1* | 8/2008 | Conrad | A47L 9/125 134/21 |
| 2010/0033818 A1 | 2/2010 | Petcavich et al. | |
| 2010/0152794 A1 | 6/2010 | Radivojevic et al. | 607/2 |

FOREIGN PATENT DOCUMENTS

| | | |
|---|---|---|
| EP | 1408014 A2 | 4/2004 |
| JP | 2007301773 A | 11/2007 |
| WO | WO 2011020944 A1 | 2/2011 |

\* cited by examiner

USER INTERFACES AND ASSOCIATED APPARATUS AND METHODS

TECHNICAL FIELD

The present disclosure relates to the field of methods for decontaminating a surface and associated apparatus. Certain disclosed aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed aspects/embodiments may provide one or more audio/text/video communication functions (e.g. tele-communication, video-communication, and/or text transmission (Short Message Service (SMS)/Multimedia Message Service (MMS)/emailing) functions), interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Operation of a user interface may involve contact between a user and a surface of the user interface. For example, a digit of a user may contact a surface of the user interface. Such contact may cause a contaminant to be deposited on the surface of the user interface. A contaminant, located on the surface of the user interface may affect performance of the user interface, or it may affect appearance of the surface of the user interface. One type of user interface, which may be affected in this way, is an electrotactile user interface.

An electrotactile user interface may comprise a conductive layer located under a dielectric layer. A digit of a user placed on the dielectric layer may result in formation of a capacitance between the conducting layer and subcutaneous tissue that is at least partly conductive. An alternating potential applied across this capacitance may result in variation in electrostatic force between the digit and the conducting layer, it may also result in variation of friction perceived by the user when the digit is moved across the dielectric layer.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

Various aspects of examples of the invention are set out in the claims.

According to a first aspect, there is provided an apparatus for a user interface, the user interface comprising a user interface surface, the user interface surface comprising a self cleaning composition, the composition being configured to draw away at least one dermatological contaminant from one or more contaminated regions of the user interface surface to thereby provide a self-cleaning user interface surface.

According to a second aspect, there is provided a method comprising:
  forming a substrate from a first material; and
  depositing a second material on the substrate to form a laminate;
  embossing the laminate using a stamp to form a user interface surface from part of the first material and part of the second material;
  wherein either the first material comprises a contaminant repellant and the second material comprises a contaminant attractant, or the first material comprises a contaminant attractant, and the second material comprises a contaminant repellant.

The present disclosure includes one or more corresponding aspects, embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

For a more complete understanding of example embodiments of the present invention, reference is now made to the following descriptions taken in connection with the accompanying drawings in which.

DESCRIPTION OF EXAMPLE ASPECTS/EMBODIMENTS

An example embodiment of the present invention and its potential advantages are understood by referring to FIGS. 1 through 10 of the drawings.

In one or more embodiments described herein, there is provided an apparatus for a user interface. This user interface comprises a user interface surface that has a self cleaning composition. The self cleaning composition is configured (e.g. formulated and/or disposed on the user interface surface) so as to draw away at least one dermatological contaminant from a contaminated region of the user interface surface (or one or more contaminated regions, e.g. that occur due to use of the user interface by a user) to thereby provide a self-cleaning user interface surface.

As discussed in the background section, during use of a user interface (e.g. a touch sensitive display), a digit of a user may contact a surface of the interface and cause a contaminant to be deposited on the interface. Such contaminants can interfere with optimal/preferable operation of the user interface. For example, a build up of grime or finger grease can obscure the user interface, or impair the electrical operation of a touch sensitive electrotactile display such that a user cannot reliably operate the user interface and associated device. By providing a user interface surface with a self cleaning composition disposed/provided thereon, it is possible to address these issues. When a contaminated region occurs on the user interface surface, the self cleaning composition draws the dermatological contaminant away from that contaminated region. This serves to break down and/or remove the contaminated region from the user interface surface to provide a clean usable user interface surface. We will now describe one or more embodiments according to the present disclosure.

Figure 1:
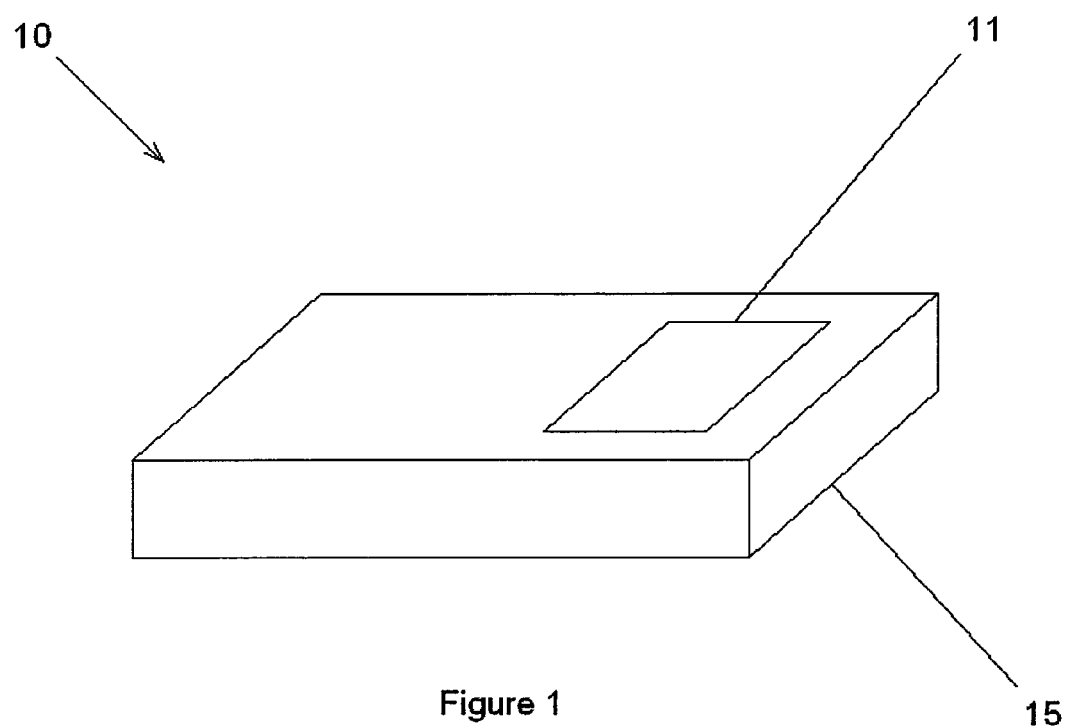
FIG. 1 schematically illustrates an apparatus according to one aspect of the invention.
Figure 2A:
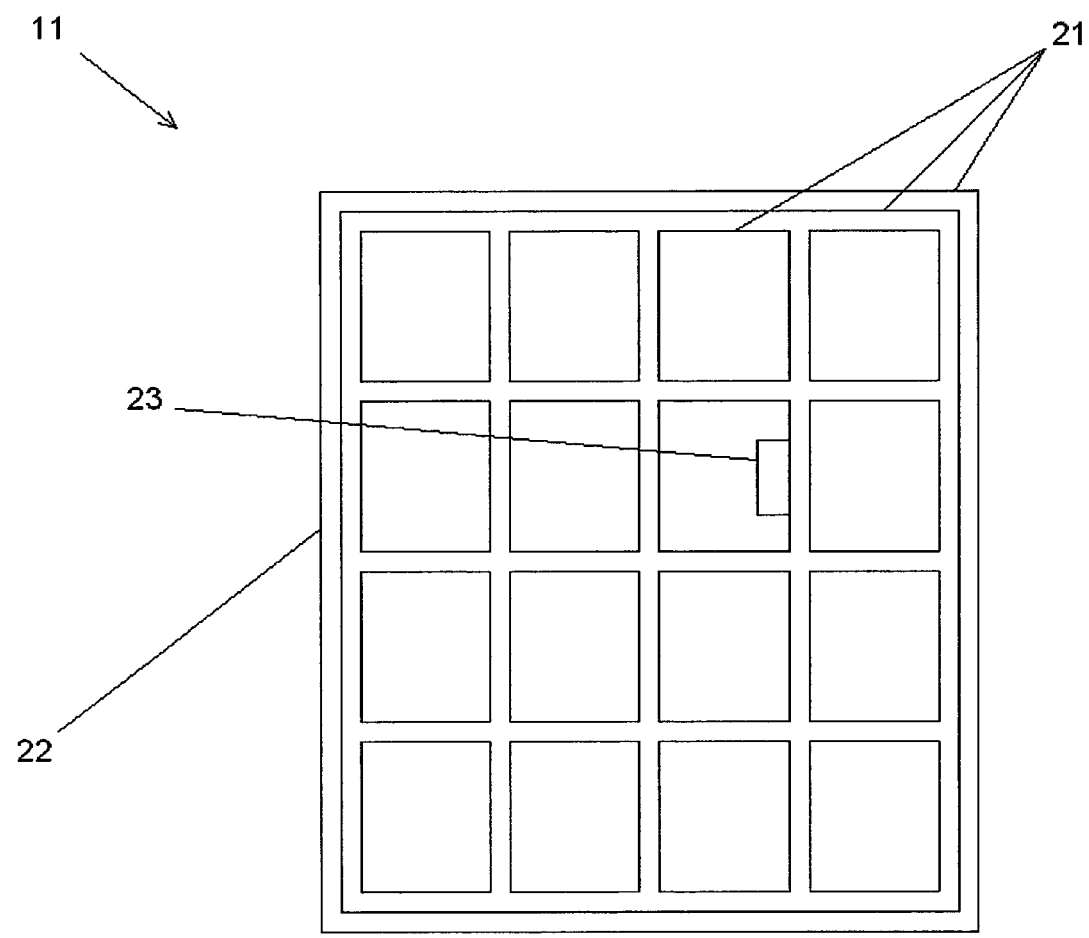
FIG. 2a schematically illustrates a component of the apparatus shown in FIG. 1.

FIG. 1 schematically illustrates an apparatus 10, for a user interface, the user interface comprising a user interface surface 11, and a housing 15. FIG. 2a schematically illustrates the user interface surface 11 shown in FIG. 1, the user interface surface 11 comprises at least part of a self cleaning composition 21, the composition being configured to draw away a contaminant from a contaminated region 23 of the user interface surface 11 to thereby provide a self-cleaning user interface surface. The contaminant may comprise one or more of: water, sweat, an electrolyte, fat, wax, oil, skin cream, nail varnish, food, one or more skin cells, part of one or more skin cells, finger nail fragment(s), natural oils, and the like. The user interface may be that for a portable electronic device, and may be a capacitive touch user interface. In some embodiments, the apparatus could merely be the user interface surface or a module for a user interface. The contaminant may be drawn towards: a drain region 22 located at the perimeter of the user interface surface 11. The drain region 22 may form part of the self cleaning composition.

Figure 3A:
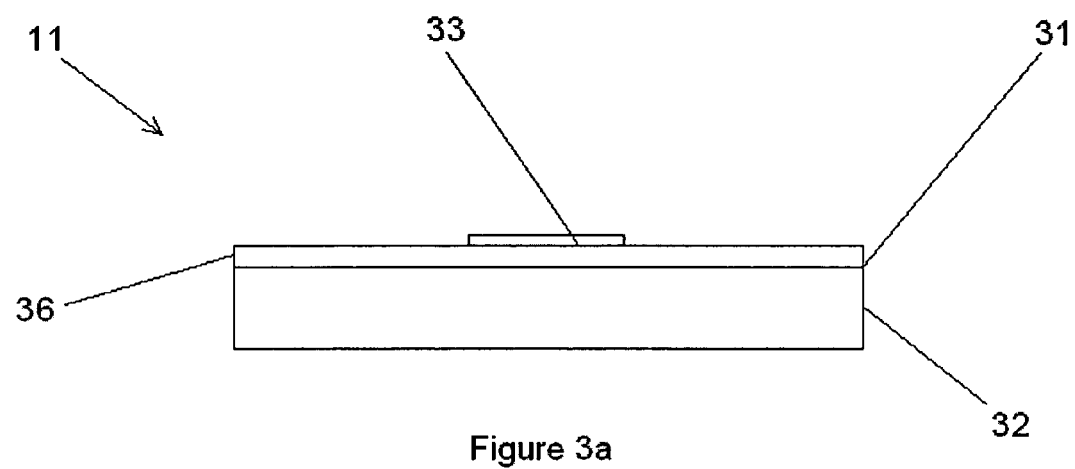
FIG. 3a schematically illustrates a component of the apparatus shown in FIG. 1.

FIG. 3a schematically illustrates a further user interface surface 11 according to a further aspect of the present invention. The user interface surface 11 comprises a self cleaning composition 31, the composition 31 being configured to draw away a contaminant from a contaminated region 33 of the user interface surface 11 to thereby provide a self-cleaning user interface surface. In FIG. 3a, the composition 31 comprises a raised portion 36, and a drain region 32, located underneath the user interface surface 11, to draw away a contaminant towards drain region 32. The drain region 32 (shown in FIG. 3a) forms part of the self cleaning composition 31.

Figure 2B:
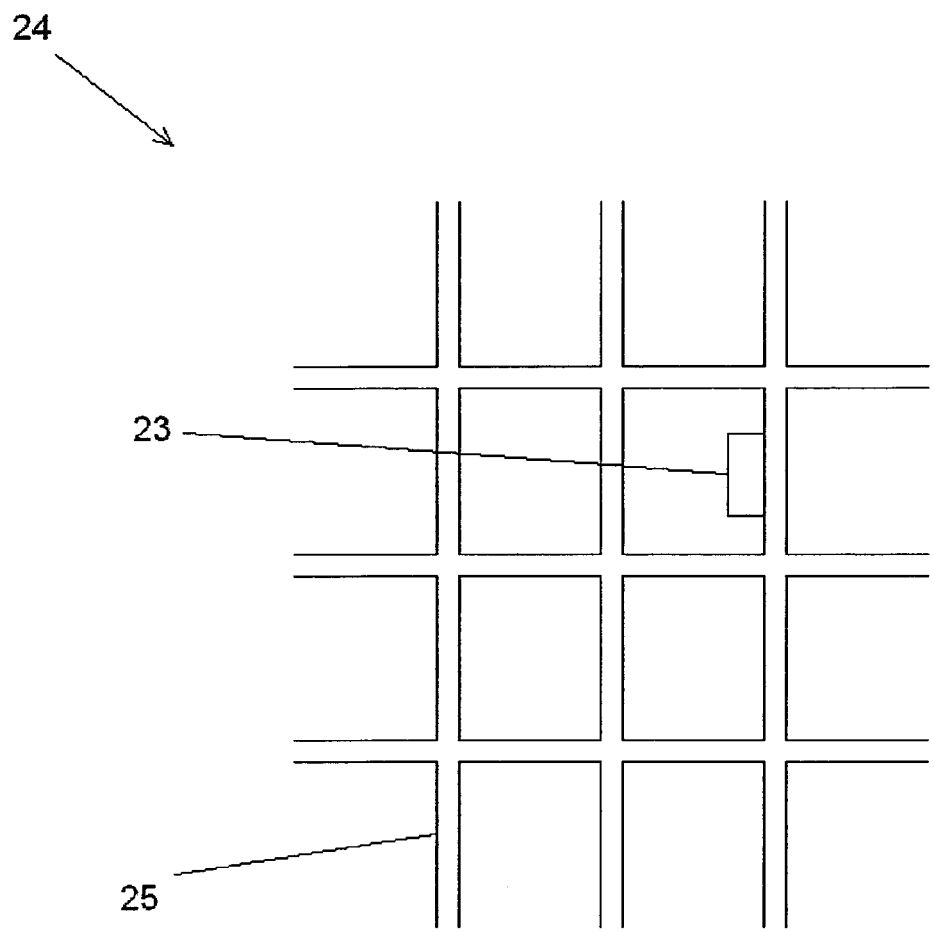
FIG. 2b schematically illustrates a component of the apparatus shown in FIG. 1.

The self cleaning composition may be configured to provide a path network 24, shown schematically in FIG. 2b, formed from one or more network paths 25, wherein the network 24 is configured to draw away a contaminant from the contaminated region 23. In other embodiments the path network may comprise a grid, a lattice, a grating.

Figure 2C:
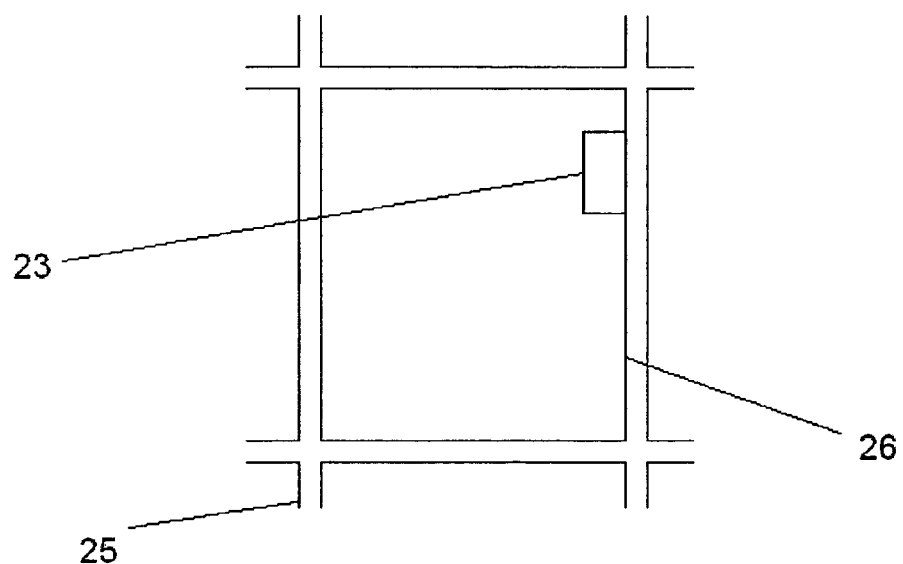
FIG. 2c schematically illustrates a component of the apparatus shown in FIG. 1.

The self cleaning composition may be configured to provide an interpath region 26, shown schematically in FIG. 2c, the interpath region 26 may comprise a hydrophobic material, and the network path 25 may comprise a hydrophilic material. In other embodiments the cleaning composition may also comprise one or more of: a contaminant repellent, and a contaminant attractant. In the FIG. 2c embodiment, the contaminant repellant may comprise a hydrophobic material from which the interpath region 26 is at least partly formed, and the contaminant attractant may comprise a hydrophilic material from which the network path 25 is at least partly formed.

A contaminant, for example water or sweat, located at the contaminated region 23, may be repelled by the hydrophobic material, and attracted by the hydrophilic material, causing the contaminant to be drawn away from the contaminated region 23, which is located in interpath region 26, towards network path 25.

The hydrophilic material may comprise a super hydrophilic material, having a contact angle of less than 5 degrees; the hydrophilic material may comprise a super hydrophilic material having a contact angle of a contact angle of zero. The hydrophilic material may comprise a material with high surface-energy, having a fine-scale roughness on the surface of the hydrophilic material. The hydrophilic material may comprise one or more of: glass, an elastomer, a metal, an inorganic metal oxide and a ceramic. The hydrophilic material may comprise one or more of: a cellulose ester, a cellulose triacetate, a cellulose diacetate, a cellulose acetate propionate, a cellulose acetate butyrate, a poly(ethylene terephthalate), a poly(ethylene naphthenate), a poly(1,4-cyclo-hexanedimethylene terephthalate), a polybutylene terephthalate), a polyimide, a polyamide; a polycarbonate, a polystyrene, polyethylene, polypropylene, polybutylene, a polysulfone, a polyacrylates, a polyetherimide, a polyvinyl chloride, a polyvinylacetate, a polyvinylamine, a polyurethane, a polyacrylonitrile, a polyacetal, a polytetrafluoroethene, a polyfluorovinylidene, a polysiloxane, and a polycarborane, a polyisoprene.

The hydrophobic material may have a low contact angle hysteresis, which is the difference between the advancing and receding contact angles, measured from the advancing and receding interface of a liquid drop sliding down the material. The hydrophobic material may comprise a material that has a low surface energy. The hydrophobic material may comprise a material having a low density of charged surface groups. The hydrophobic material may comprise a fluoropolymer. The hydrophobic material may comprise self-assembled layers of molecules having a high percentage of hydrocarbon or fluorine such as thiols, phosphonates, and silanes. The hydrophobic material may have a fine-scale roughness. The user interface surface may comprise a super hydrophilic area, x, and a super hydrophobic area y, the ratio x:y may be between 8:2 and 6:4, the ratio x:y may be approximately 7:3.

Figure 9:
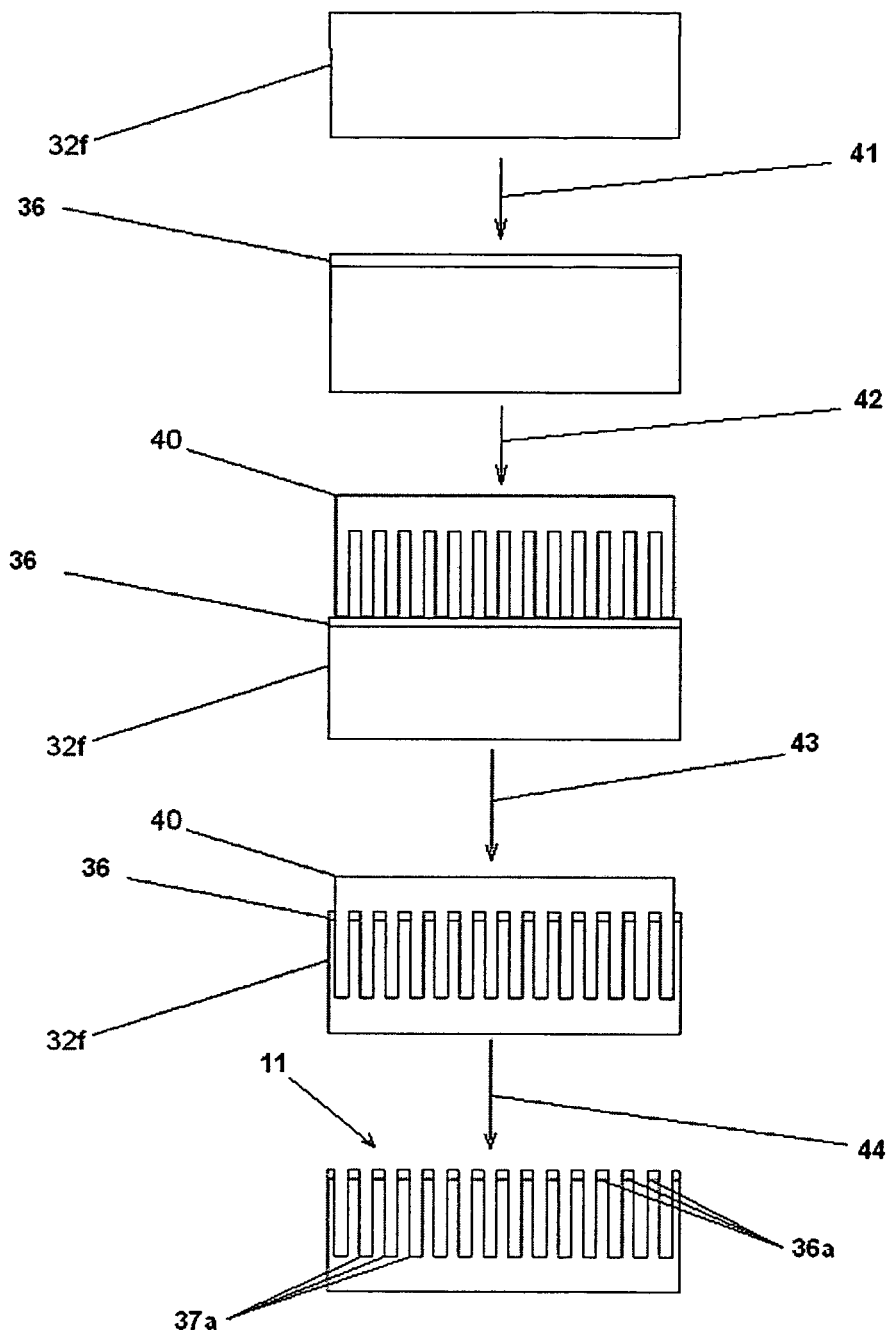
FIG. 9 schematically illustrates a method of fabricating a component of the apparatus shown in FIG. 1.
Figure 10:
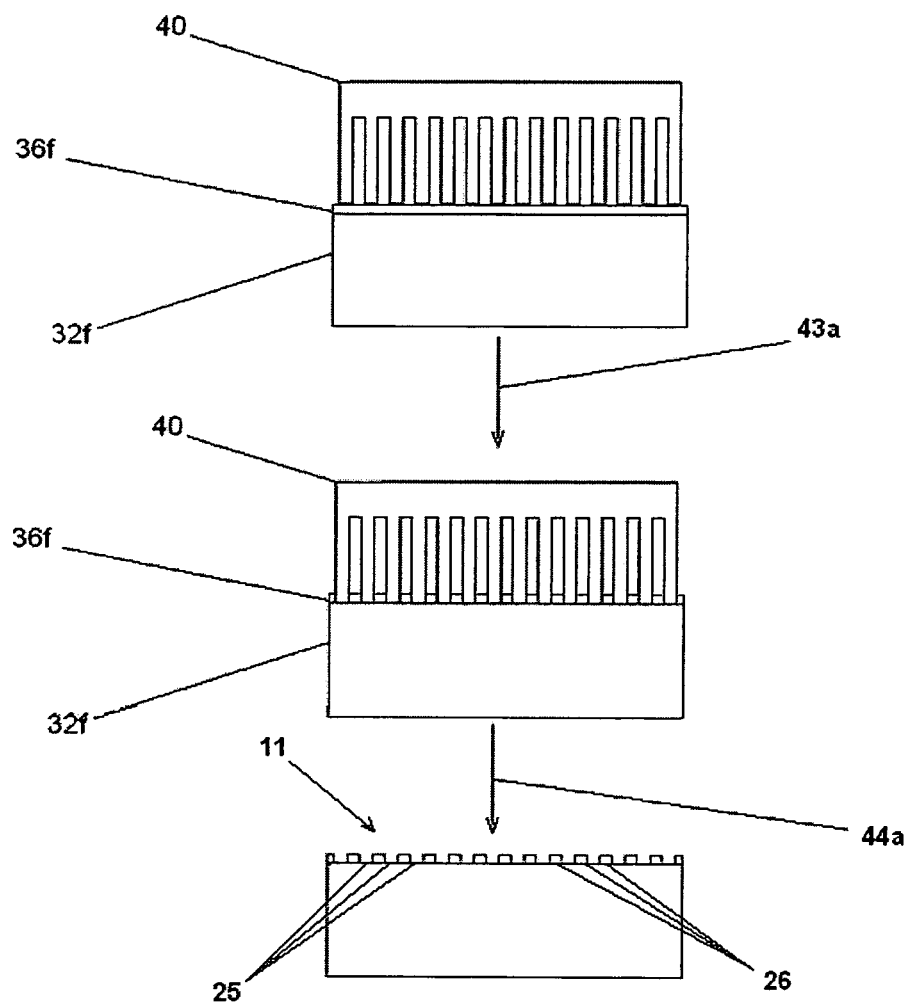
FIG. 10 schematically illustrates a method of fabricating a component of the apparatus shown in FIG. 1.

FIG. 9 schematically illustrates a method of micro-replication, for fabricating a user interface surface. Micro-replication is described in US 2006236877, and US 2006251803, which are herein incorporated by reference. A hydrophobic material 36 may be deposited, at step 41, on a substrate formed from a hydrophilic material 32f. The substrate may have a thickness between 50 µm and 1000 µm. The substrate may have a thickness between 75 µm and 300 µm. The substrate may also comprise one or more of: an antioxidant, an antistatic agent, and a plasticizer. For example a coating solution comprising the hydrophobic material 36 may be deposited, at step 41, on the hydrophilic material 32f by one or more of: bead coating, curtain coating, inkjet coating, electrostatic spray coating.

The hydrophilic material 32f, coated with the hydrophobic material 36, may be embossed, at step 43, using a stamp 40 having features such that, after the stamp is removed at step 44, the hydrophobic material remains substantially intact for un-embossed region 36a, yet is substantially removed from embossed region 37a. In an alternative embodiment, schematically illustrated in FIG. 10, step 43 may be replaced by step 43a, and step 44 may be replaced by step 44a. Step 43 is similar to step 43a; step 43 causes both the hydrophobic material 32f and the hydrophilic material 36 to be deformed after removal of the stamp at step 44. By contrast, step 43a causes the hydrophobic material 32f to be deformed, and the hydrophilic material to be substantially undeformed, after removal of the stamp at step 44a, to leave un-embossed region 26, and embossed region 25. A user interface surface 11 may comprise a hydrophobic un-embossed region 26, 36a; and a hydrophilic embossed region 25, 37a. A drop of water may be drawn away from the hydrophobic un-embossed region 26, 36a towards the hydrophilic embossed region 25, 37a.

Figure 3E:
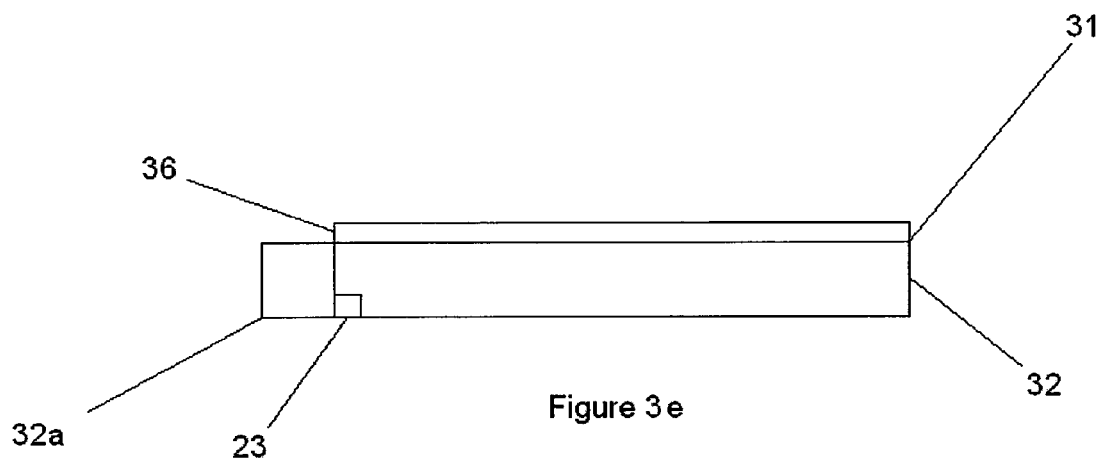
FIG. 3e schematically illustrates a component of the apparatus shown in FIG. 1.
Figure 3B:
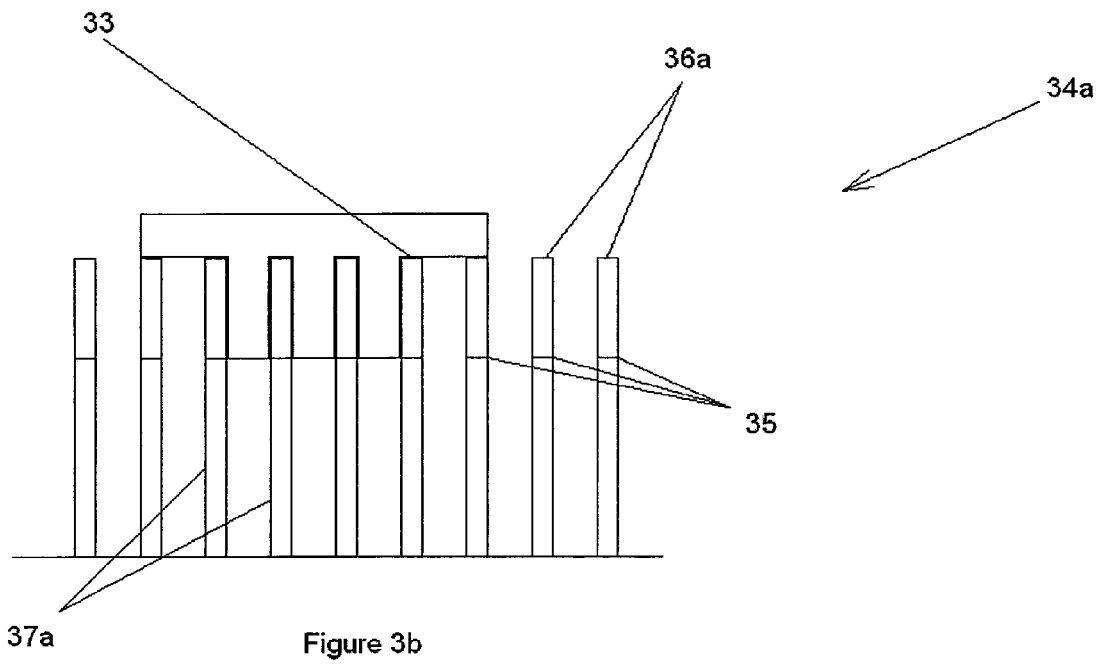
FIG. 3b schematically illustrates a component of the apparatus shown in FIG. 1.

The user interface surface may be configured to define a topographical profile, for example a columnar topographical profile 34a, shown schematically in FIG. 3b, having: one or more cylindrical raised portions 36a, to define a upper area of the user interface surface; and one or more lower portions 37a, defined between the raised portions 36a, the lower portions 37a defining a lower area of the user interface surface relative to the upper area, wherein columns 35, formed from the self cleaning composition, are configured to draw away dermatological contaminants from the upper area to the lower area of the user interface surface to thereby provide a self cleaning user interface surface.

Figure 3C:
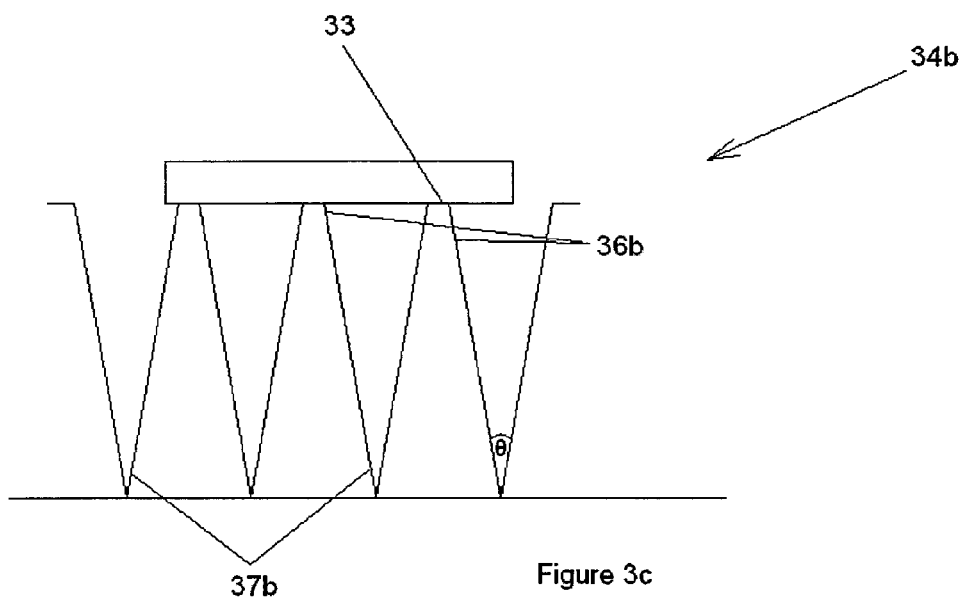
FIG. 3c schematically illustrates a component of the apparatus shown in FIG. 1.

In an alternative embodiment, shown schematically in FIG. 3c, a columnar topographical profile 34b may comprise conical raised portions 36b, which facilitates drawing away of the contaminant from the contaminated region by capillary action. Grooves 37b each have angle, θ that may be less than 90 degrees; θ may be less than 45 degrees. Columnar topographic profile 34b may comprise an electrically conductive material coated with hydrophilic and hydrophobic material.

Figure 3D:
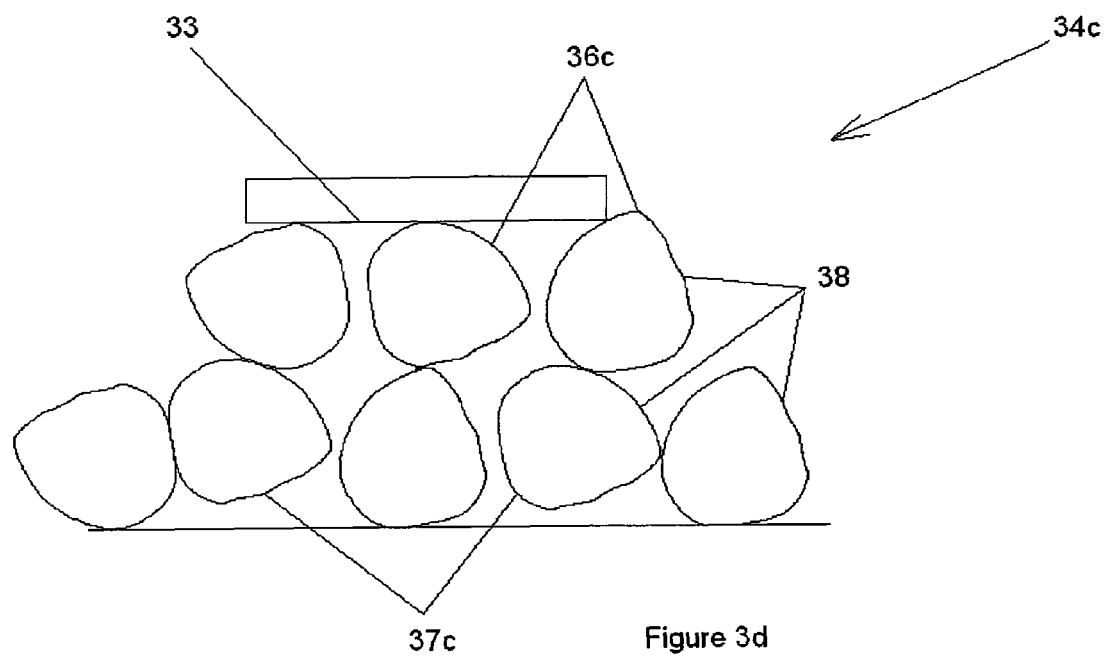
FIG. 3d schematically illustrates a component of the apparatus shown in FIG. 1.

In an alternative embodiment, shown schematically in FIG. 3d, a topographical profile may comprise a particulate topographical profile 34c, wherein particles 38, formed from the self cleaning composition, are configured to draw away dermatological contaminants from the upper area 36c to the lower area 37c of the user interface surface to thereby provide a self cleaning user interface surface. A porous structure, for example a porous structure formed from particles, such as those shown schematically in FIG. 3d, may facilitate drawing away of the contaminant by capillary action, and may trap the contaminant in the porous structure, away from the contaminated region.

For embodiments shown in FIGS. 3b, 3c, and 3d, a contaminant repellant may comprise a hydrophobic material from which the raised portions 36a, 36b, 36c are at least partly formed, and the contaminant attractant may comprise a hydrophilic material from which the lower portions 37a, 37b, 37c are at least partly formed. A contaminant, for example water or sweat, located at the contaminated region 33, may be repelled by the raised portions 36a, 36b, 36c and attracted by the lower portions 37a, 37b, 37c, causing the contaminant to be drawn away from the contaminated region 33.

Figure 2D:
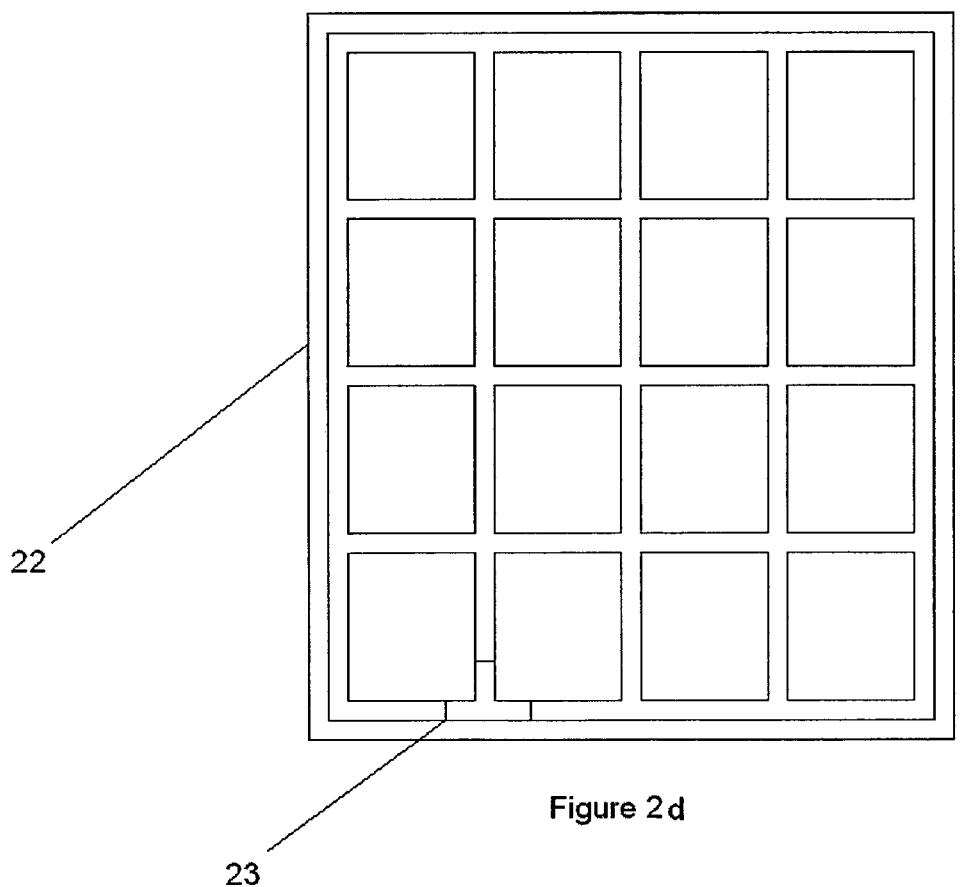
FIG. 2d schematically illustrates a component of the apparatus shown in FIG. 1.

FIG. 2d schematically illustrates a contaminant, located at a contaminated region 23, which may be drawn towards a drain region 22 located at the perimeter of the user interface surface 11. The drain region 22 may form part of the self cleaning composition that is configured to draw away dermatological contaminants from the contaminated region 23, to the drain region 22, which in the FIG. 2e embodiment, is positioned separately from the user interface surface. For example the dermatological composition, located at the contaminated region 23, may comprise a hydrophilic material, and that located at the drain region 22 may comprise a super-hydrophilic material. If the contaminant is water then it will be attracted from the contaminated region 23 to the drain region 22 by the difference in surface energy and wettability.

FIG. 3e schematically illustrates a self cleaning composition 31, the composition 31 comprising a raised portion 36, and a drain region 32, which has drawn away a contaminant 23 from the raised portion 36. For the FIG. 3e embodiment, the drain region 32 also comprises an adjacent region 32a, positioned separately from the user interface surface. The drain region 32 may comprise a hydrophilic material, and the adjacent region 32a may comprise a super-hydrophilic material. A contaminant 23, located at the drain region 32 may be attracted the adjacent region 32a, by virtue of the surface energy difference between the two regions 32, 32a.

Figure 4:
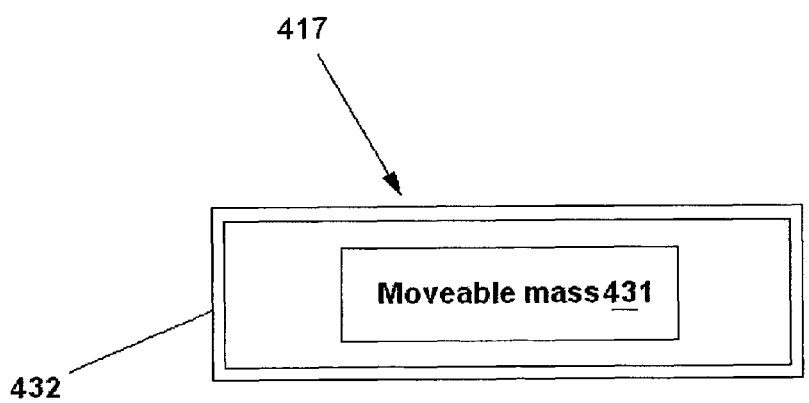
FIG. 4 schematically illustrates a component of the apparatus shown in FIG. 1.

The apparatus 10, schematically shown in FIG. 1, may be configured to use vibration, from a component, such as a tactile actuator, to facilitate drawing away at least one dermatological contaminant from one or more contaminated regions of the user interface surface. The tactile actuator is schematically illustrated in FIG. 4. The tactile actuator 417 may be configured to generate vibration that facilitates the drawing away, of a contaminant from one or more contaminated regions of the user interface surface, from a contaminated region. The tactile actuator 417 comprises a movable mass 431 and a base 432. The moveable mass 431 is moveable relative to the base 432 in at least one dimension. The tactile actuator 417 may comprise, for example, an eccentric rotating motor, a harmonic eccentric rotating motor, a solenoid, a resistive actuator, a piezoelectric actuator, an electro-active polymer actuator, or other types of active/passive actuators suitable for generating tactile output.

Force may be applied from the base 432 to the moveable mass 431 and in a similar fashion from the moveable mass 431 to the base 432. The force transfer can occur, for instance, via magnetic forces, spring forces, and electrostatic forces, piezoelectric forces, and mechanical forces.

The base 432 may be connected to the other parts of the apparatus 10, including the user interface surface 11, so that movement of the mass 431 causes forces to be generated between the mass 431 and the base 432, and these forces may be transmitted to the user interface surface 11. In this way vibrational energy may be transmitted to a contaminant, causing it to move away from the contaminated region. For example the base 432 may be bonded to or integral with a housing of the apparatus 10, and may be located within the housing, so that movement of the mass may cause the housing of the electronic device 230 to vibrate thereby generating a force that tends to cause a contaminant to move away from the contaminated region 14.

The moving mass 431 may comprise, for instance, a permanent magnet, electromagnet, ferromagnetic material, and/or a combination of thereof. The base 432 may comprise, for instance, a permanent magnet, an electromagnet, ferromagnetic material, or any combination of these.

In an alternative embodiment, the tactile actuator may comprise one or more piezoelectric actuators. The tactile actuator may be configured to generate vibration substantially parallel to the user interface surface. The tactile actuator may be configured to generate vibration substantially perpendicular to the user interface surface. The tactile actuator may be configured to vibrate with a frequency between 10 and 1000 Hz.

Figure 5:
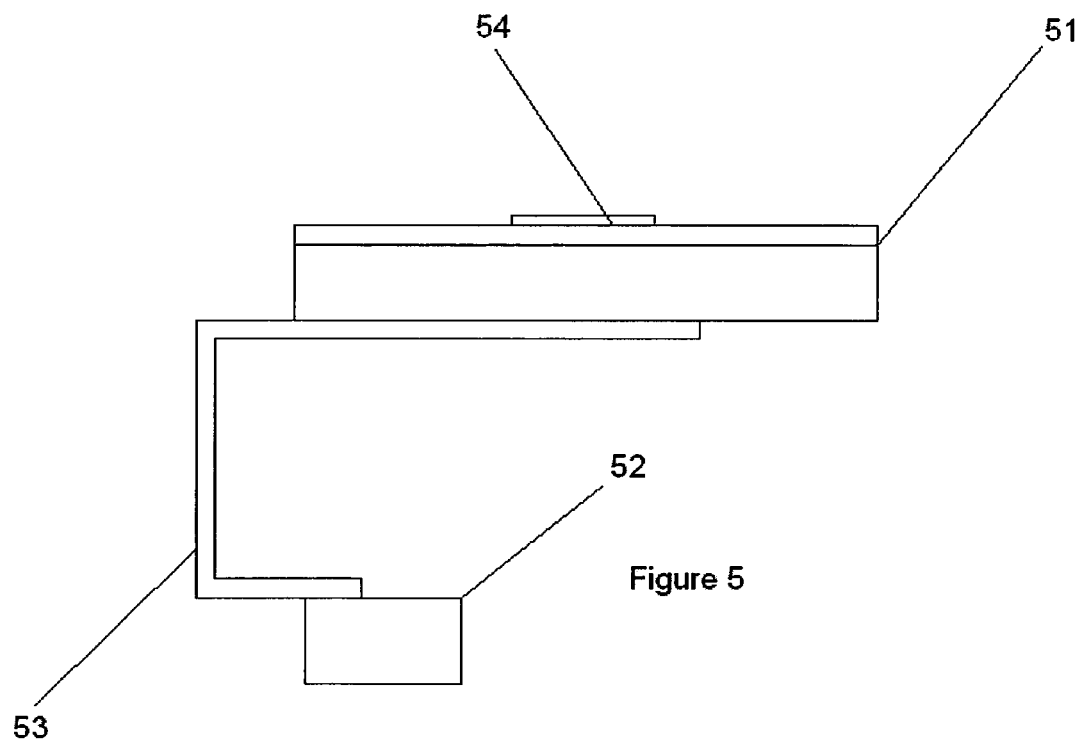
FIG. 5 schematically illustrates a component of the apparatus shown in FIG. 1.

The apparatus 10, shown in FIG. 1, may comprise a hot component 52, and a thermally conducting heat pipe 53, schematically illustrated in FIG. 5. Heat from the hot component 52 (for example a display back-lighting source) may be conducted by the heat pipe 53 to the self cleaning composition 51. A solid contaminant may be melted by the conducted heat, or a liquid phase contaminant may be made less viscous by the conducted heat, making it easier to draw it away or evaporate from the contaminated region 54. Thermal energy of contaminant molecules or atoms, resulting from the conducted heat, may also allow a contaminant to be drawn away from the contaminated region 54.

Figure 6A:
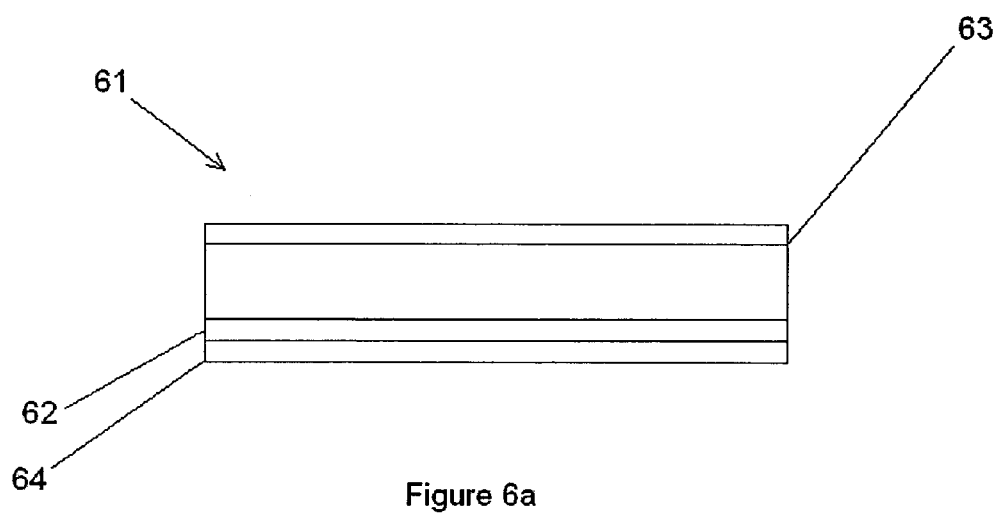
FIG. 6a schematically illustrates a component of the apparatus shown in FIG. 1.
Figure 6B:
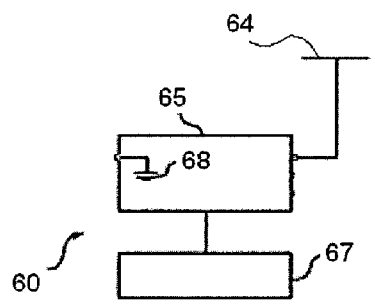
FIG. 6b schematically illustrates a component of the apparatus shown in FIG. 1.

The user interface surface 61 may form part of an electrotactile apparatus 60, schematically illustrated in FIGS. 6a and 6b, which comprises a dielectric 62 that lies under a self cleaning composition 63, and an electrode 64 that lies under the dielectric 62. In other embodiments, the self cleaning composition may comprise at least part of the dielectric layer. The dielectric layer 62 insulates the electrode 64 from a user who touches the user interface surface 61. A controller 65, schematically illustrated in FIG. 6b, is configured to apply a time varying potential to an electrode 64 and configured to control at least the time variation in the potential.

In use, a user's digit contacts the user interface surface 61. The electric field, between the user, and the electrode 64, resulting from the application of a potential to the electrode 64, produces a time-varying force that provides a touch stimulus to the digit of the user, while in contact with the surface of the user interface. The time varying force modulates the frictional force applied to the touching digit, which creates a modulating shear force at the surface of the digit when the digit is traced over the surface of the user interface. This variation of the shear force is perceived by the user, and the perception can be modified by controlling at least the time variation of the applied potential difference. A contaminant may form a conducting layer which effectively screens the applied potential and results in a reduction in the perceived force. The time varying force also results in vibration of the user interface surface 61 such vibration may facilitate drawing away of the contaminant. The current that flows as a consequence of the applied time varying potential difference is typically less that 5 µA which is less than the current required for direct activation of nerves or muscle.

The electrode 64 may be formed from any suitable conducting material. The electrode 64 may comprise a metal selected from one or more of: aluminium, copper, and gold. The electrode 64 may comprise a conducting oxide selected from one or more of: indium-tin-oxide, fluorine doped tin oxide, and aluminium doped zinc oxide. The electrode 64 may comprise a transparent metallic mesh utilizing thin metal wires of silver, or copper, carbon nanotubes or graphene, or a conducting polymer material based upon polythiophene. The dielectric layer 62 may be a dielectric layer with a high relative permittivity such as hafnium oxide ($HfO2$), barium titanate $BaTiO3$, or strontium titanate $SrTiO3$ or mixed oxides of barium and strontium titanate (Perovskite), aluminium oxide ($Al2O3$) and titanium oxide ($TiO2$). The dielectric layer may provide a hard, smooth surface for contact with a user's digit.

The apparatus comprises an electrode 64, a controller 65, an energy source 67, a reference ground or earth 68. For example, the controller 65 may provide a periodically varying potential difference that has a variable periodicity (frequency). The frequency may, for example, be varies between 1 and 100 Hz to give a qualitative indication of an event such as arrival of new message (5 Hz), missed call (20 Hz) and a proximity alert (100 Hz).

As another example, the controller 65 may provide a periodically varying potential difference that has a variable periodicity (frequency). The frequency may, for example, vary between 1 Hz and 1 kHz to give a quantitative indication.

Figure 7:
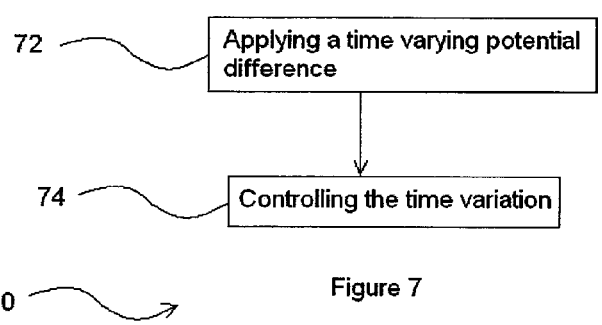
FIG. 7 schematically illustrates a method of using an apparatus shown in FIG. 1, according to one aspect of the invention.

FIG. 7 schematically illustrates a method 70. At block 72, the controller 65, applies a time varying potential to electrode 64 of an apparatus 60. At block 74, the controller 65 changes at least the time variation in the potential difference to convey information to a user. The change may be a change in periodicity of a periodic potential difference applied between electrodes.

The controller 65 may be implemented using instructions that enable hardware functionality, for example, by using executable computer program instructions in a general-purpose or special-purpose processor that may be stored on a computer readable storage medium (disk, memory etc) to be executed by such a processor.

Figure 8:
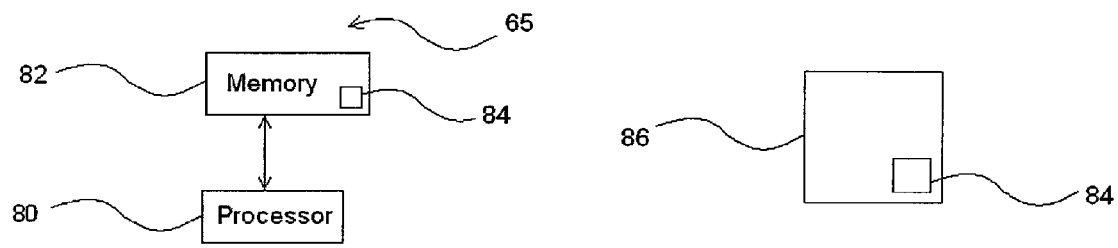
FIG. 8 schematically illustrates a component of the apparatus shown in FIG. 1.

FIG. 8 schematically illustrate an example of one implementation of a controller for the apparatus. The controller 65 comprises a processor 80 and a memory 82. It also comprises a signal generator controlled by the processor 80 to apply different time varying potential and electrode 64.

The processor 80 is configured to read from and write to the memory 82. The processor 80 may also comprise an output interface via which data and/or commands are output by the processor 80 and an input interface via which data and/or commands are input to the processor 80.

The memory 82 stores a computer program 84 comprising computer program instructions that control the operation of the controller 65 when loaded into the processor 80. The computer program instructions 84 provide the logic and routines that enables the apparatus to perform the methods illustrated in FIG. 7. The processor 80 by reading the memory 82 is able to load and execute the computer program 84.

The computer program may arrive at the controller 65 via any suitable delivery mechanism 86. The delivery mechanism 86 may be, for example, a computer-readable storage medium, a computer program product, a memory device, a record medium such as an article of manufacture that tangibly embodies the computer program 84. The delivery mechanism may be a signal configured to reliably transfer the computer program 84.

Although the memory 82 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other devices. References to computer program, instructions, code etc. should be understood to encompass software for a programmable processor or firmware such as, for example, the programmable content of a hardware device whether instructions for a processor, or configuration settings for a fixed-function device, gate array or programmable logic device, etc.

The controller 65 may be provides as a module. A moving touch electrode may also be provided as a module. A reference electrode may also be provided as a module. As used here 'module' refers to a unit or apparatus that excludes certain parts/components that would be added by an end manufacturer or a user.

The blocks illustrated in the FIG. 7 may represent steps in a method and/or sections of code in the computer program 64. The illustration of a particular order to the blocks does not necessarily imply that there is a required or preferred order for the blocks and the order and arrangement of the block may be varied. Furthermore, it may be possible for some steps to be omitted.

Without in any way limiting the scope, interpretation, or application of the claims appearing below, a technical effect of one or more of the example embodiments disclosed herein is to draw away a contaminant from a contaminated region of a user interface. Another technical effect of one or more of the example embodiments disclosed herein is to ensure that performance of a user interface is not adversely affected by contamination of its surface. Another technical effect of one or more of the example embodiments disclosed herein is to ensure that performance of an electrotactile user interface is not adversely affected by contamination of its surface.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/processor may have other functions in addition to the mentioned functions, and that these functions may be performed by the same apparatus/circuitry/processor. One or more disclosed aspects may encompass the electronic distribution of associated computer programs and computer programs (which may be source/transport encoded) recorded on an appropriate carrier (e.g. memory, signal).

It will be appreciated that any "computer" or "controller" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

With reference to any discussion of any mentioned computer and/or controller and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
    a user interface, the user interface comprising a user interface surface, the user interface surface comprising at least part of a self-cleaning composition, wherein the self-cleaning composition comprises an upper area and a drain region, wherein at least a first part of the drain region is positioned directly underneath the upper area of the user interface surface, and at least a second part of the drain region is positioned separately from the user interface surface, and wherein the drain region comprises a contaminant attractant that facilitates at least one dermatological contaminant to be drawn away from one or more contaminated regions of the user interface surface towards the drain region so that the at least one dermatological contaminant is substantially separate from the user interface surface.

2. The apparatus of claim 1, wherein the at least one dermatological contaminant is drawn away from the one or more contaminated regions of the user interface surface towards one or more of:
    the perimeter of the user interface surface, and
    the underneath of the user interface surface.

3. The apparatus of claim 1, wherein the drain region is positioned at least partially towards the perimeter of the user interface surface.

4. The apparatus of claim 1, wherein the drain region is configured to provide a path network formed from one or more network paths, wherein the respective network paths are configured to draw away dermatological contaminants from the user interface surface.

5. The apparatus of claim 1, wherein the self-cleaning composition further comprises a contaminant repellent.

6. The apparatus of claim 5, wherein the self-cleaning composition is distributed such that the contaminant repellent is provided with the upper area of the user interface surface to thereby promote drawing away of contaminants from the upper area of the user interface surface.

7. The apparatus of claim 5, wherein the contaminant attractant comprises a hydrophilic or a lyophilic material, and the contaminant repellent comprises a lyophobic or a hydrophobic material.

8. The apparatus of claim 1, wherein the user interface surface is comprised on a dielectric of a capacitive touch user interface.

9. The apparatus of claim 1, wherein the user interface surface forms part of an electrotactile apparatus.

10. The apparatus of claim 1, further comprising an actuator that facilitates the at least one dermatological contaminant to be drawn away from the one or more contaminated regions of the user interface surface.

11. A portable electronic device comprising the apparatus of claim 1.

12. The apparatus according to claim 1, wherein the first part of the drain region comprises a hydrophilic material and the second part of the drain region comprises a super-hydrophilic material such that the first part of the drain region and the second part of the drain region are configured such that contaminants from the first part of the drain region are attracted to the second part of the drain region.

13. The apparatus of claim 1, further comprising a thermally conducting heat pipe that transfers heat from a component of a portable electronic device to at least a part of the user interface surface, to facilitate the at least one dermatological contaminant to be drawn away from the one or more contaminated regions of the user interface surface.

14. The apparatus according to claim 12, wherein the component is a display back-lighting source.

* * * * *